US006943613B2

United States Patent
Miyazaki et al.

(10) Patent No.: US 6,943,613 B2
(45) Date of Patent: Sep. 13, 2005

(54) SEMICONDUCTOR INTEGRATED CIRCUIT DEVICE IN WHICH OPERATING FREQUENCY, SUPPLY VOLTAGE AND SUBSTRATE BIAS VOLTAGE ARE CONTROLLABLE TO REDUCE POWER CONSUMPTION

(75) Inventors: Masayuki Miyazaki, Tokyo (JP); Koichiro Ishibashi, Warabi (JP)

(73) Assignee: Renesas Technology Corp., Tokyo (JP)

( * ) Notice: Subject to any disclaimer, the term of this patent is extended or adjusted under 35 U.S.C. 154(b) by 0 days.

(21) Appl. No.: 10/888,983

(22) Filed: Jul. 13, 2004

(65) Prior Publication Data

US 2004/0239394 A1 Dec. 2, 2004

Related U.S. Application Data

(63) Continuation of application No. 09/811,387, filed on Mar. 20, 2001, now Pat. No. 6,774,705.

(30) Foreign Application Priority Data

May 30, 2000 (JP) ........................................ 2000-164717

(51) Int. Cl.[7] .............................................. H03K 3/01
(52) U.S. Cl. ....................................... 327/534; 327/544
(58) Field of Search ................................. 327/534, 538, 327/540, 541, 543, 544

(56) References Cited

U.S. PATENT DOCUMENTS

| 6,380,764 B1 | 4/2002 | Katoh et al. |
| 6,388,483 B1 | 5/2002 | Mizuno et al. |
| 6,774,705 B2 * | 8/2004 | Miyazaki et al. ............ 327/534 |

OTHER PUBLICATIONS

2000 International Solid–State Circuits Conference Digest of Technical Papers, pp. 294–295 (Feb. 2000).

* cited by examiner

Primary Examiner—Kenneth B. Wells
(74) Attorney, Agent, or Firm—Antonelli, Terry, Stout and Kraus, LLP

(57) ABSTRACT

A semiconductor integrated circuit device includes control circuits FRQCNT, VDDCNT and VBBCNT that generate the optimum clock signal, supply voltage and substrate bias respectively and then supply them to a main circuit LSI. This operation makes it possible to suppress the variations of a CMOS circuit characteristic, thereby improving the circuit performance. Further, the low power consumption is realized without degrading the operating speed of the CMOS circuit or increasing the power consumption of the CMOS circuit.

9 Claims, 17 Drawing Sheets

| FRQ | VDD (WITHOUT VBB) | VDD (WITH VBB) |
|---|---|---|
| 200 MHz | 1.7V | 1.4V |
| 100 MHz | 1.2V | 0.9V |
| 50 MHz | 1.0V | 0.8V |

SEMICONDUCTOR INTEGRATED CIRCUIT DEVICE IN WHICH OPERATING FREQUENCY, SUPPLY VOLTAGE AND SUBSTRATE BIAS VOLTAGE ARE CONTROLLABLE TO REDUCE POWER CONSUMPTION

CROSS-REFERENCE TO RELATED APPLICATIONS

This is a Continuation application of Ser. No. 09/811,387 filed Mar. 20, 2001 now U.S. Pat. No. 6,774,705, the entire disclosure of which is hereby incorporated by reference.

BACKGROUND OF THE INVENTION

The present invention relates to a semiconductor integrated circuit device, and more particularly to a semiconductor integrated circuit device which may be operated at both high speed and low electric power.

In order to improve the performance of semiconductor integrated circuit devices composed of CMOS circuits, some methods have been proposed such as shrinkage of MOS transistors that are a components of the CMOS circuitry, lowering of absolute values of threshold voltages of the MOS transistors, and raising of a supply voltage. In actuality, however, with improvement of an operating speed of the CMOS circuit, the power consumption is increased accordingly. For example, as the threshold voltage of the MOS transistor is made lower and lower, the operating speed becomes higher and higher, but the leak current is also increased. Likewise, with enhancement of the supply voltage, the operating speed is improved but the operation power is increased as well. The increase of the power consumption gives rise to disadvantages of degrading the circuit performance and bringing about an erroneous operation. The heat caused by the increase of the power consumption has the adverse effect on the mount of the semiconductor integrated circuit device, which disadvantageously leads to enhancing the manufacturing cost. Therefore, faster operation and lower power consumption have been significant issues to improving the performance of the CMOS circuit.

As a method of overcoming these disadvantages, for example, reference may be made to the technique disclosed in 2000 International Solid-State Circuits Conference Digest of Technical Papers, pp. 294–295 (February, 2000). This technique is arranged so that a processor that is operated at high speed and low electric power may be realized by controlling the operating clock frequency and the supply voltage of a microprocessor composed of a CMOS circuit. If fast operation is required, by enhancing the clock frequency and the supply voltage, the operating speed may be improved while making the power consumption larger. On the other hand, if slow operation is allowed, by lowering the clock frequency and the supply voltage, the power consumption may be reduced. The combinational adjustment of these controls through the operating system realizes the fast operation and the low power consumption of the microprocessor.

In order to realize the semiconductor integrated circuit device composed of a CMOS circuit such as a microprocessor that is operated at high speed and low electric power, the foregoing technique of controlling the operating clock frequency and the supply voltage of the CMOS circuit is an effective means. This technique makes it possible to speed up the clock frequency and enhance the supply voltage when the microprocessor operates at high speed and on the contrary to lower the clock frequency and the supply voltage when it operates at low electric power or low speed, thereby improving the performance of the microprocessor.

In recent days, the MOS transistor is shrunken more and more. As a result, the dimensions and performances of the transistors in the manufacturing process are made greatly variable. FIG. 3 shows dependency of a supply voltage on an operating frequency of a CMOS circuit. In FIG. 3, an axis of abscissa denotes a supply voltage and an axis of ordinates denotes an operating frequency. As shown, mainly because of the variations in the performance of the transistor, the operating frequency of the CMOS circuit varies in the range of the highest (best) speed, the standard (typical) speed and the low (worst) speed at the same supply voltage. If the CMOS circuit having such variations in an operating speed is used for composing the semiconductor integrated circuit device such as a microprocessor, the operating speed guaranteed to the device is determined to be the worst speed. As shown, as the supply voltage is made lower, the operation of the CMOS circuit is made slower accordingly. In the worst speed, the degrade of the operating speed is quite conspicuous, which is an obstacle to the performance of the microprocessor.

The possible suppression of the variations in the operating characteristic in the CMOS circuit leads to guaranteeing the typical speed as shown in FIG. 3. This results in making the CMOS circuit far faster in operation and lower in power consumption. The variations can be realized by controlling the substrate bias of the MOS transistor.

It is a first object of the present invention to provide a semiconductor integrated circuit device which is arranged to suppress the characteristic variations of the CMOS circuit and thereby to improve the circuit performance.

It is a second object of the present invention to provide a semiconductor integrated circuit device which may be operated at low electric power and is suitable especially to a portable instrument operated by a built-in battery without degrading the operating speed.

It is a third object of the present invention to provide a semiconductor integrated circuit device which may be operated at high speed without having to increase the power consumption.

It is a fourth object of the present invention to provide a system having the above-mentioned semiconductor integrated circuit mounted thereon which may be battery-operated for a longer length of time.

SUMMARY OF THE INVENTION

In carrying out the foregoing objects, the present invention offers the following concrete arrangements.

A semiconductor integrated circuit device includes a main circuit composed of at least one MOS transistor, a clock frequency controlling circuit for controlling a frequency of a clock signal to be supplied to the main circuit, a power voltage controlling circuit for controlling a supply voltage to be supplied to the main circuit, and a substrate bias controlling circuit for controlling a substrate bias to be supplied to a well where the MOS transistor of the main circuit is formed, wherein the semiconductor integrated circuit device controls a frequency of a clock signal, a value of a supply voltage and a value of the substrate bias according to the operating performance to be requested by the main circuit.

The limit value of the consumed power that is one parameter of the operating performance is changed according to the remaining quantity of the battery power for feeding the device. If the remaining quantity is smaller, the consumed power is reduced, so that the life of the battery is extended.

In addition, a command signal generated by a command generating circuit may be determined on a command to be sent from the operating system, a command to be sent from an application software, a signal to be inputted from the external to the semiconductor integrated circuit device, a signal to be sent from a memory such as ROM or FLASH, or an amount of load to be processed by the main circuit.

The main circuit is divided into two or more blocks, in each of which blocks the clock frequency, the supply voltage and the substrate bias are controlled so that the most approximate performance may be achieved. This makes it possible for the main circuit to operate on the operating characteristics according to the processing load to be done by each block, for realizing more minute control.

Further, the system arranged to use the foregoing semiconductor integrated circuit device is disclosed. In the system including the semiconductor integrated circuit device, the battery, and the voltage converting circuit, the semiconductor integrated circuit device is supplied with the electric power from the battery through the voltage converter. According to the present invention, a switch is provided so that the electric power from the battery may be directly supplied to the semiconductor integrated circuit device without passing through the voltage converter. If the quantity of the remaining power of the battery is made smaller, the device is fed directly from the battery without passing through the voltage converter by operating the switch. In this feeding, the voltage converter is not required, which leads to extending the battery life.

DETAILED DESCRIPTION OF THE EMBODIMENTS

Hereafter, the description will be oriented to an embodiment of the present invention with reference to the appended drawings.

Figures 1, 2:
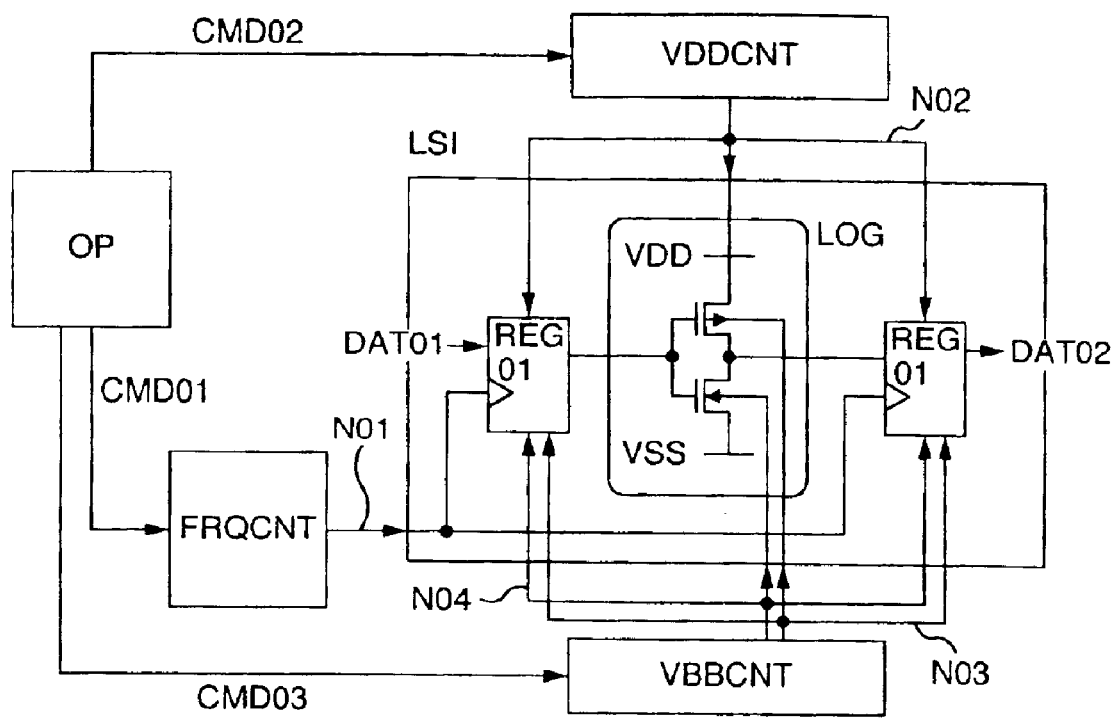
FIG. 1 is a block diagram showing an embodiment of the present invention.
FIG. 2 is a table showing correspondence between a clock frequency and a supply voltage.

FIG. 1 shows an embodiment of the present invention.

The semiconductor integrated circuit device of this embodiment includes a main circuit LSI that is a semiconductor integrated circuit such as a microprocessor composed of a CMOS circuit, a command generating circuit OP, a clock frequency controlling circuit FRQCNT, a power supply controlling circuit VDDCNT, and a substrate bias controlling circuit VBBCNT. The command generating circuit OP is served to output command signals CMD01, CMD02 and CMD03. The clock frequency controlling circuit FRQCNT is supplied with the command signal CMD01 and generates a clock signal having the corresponding frequency therewith as N01. The power supply controlling circuit VDDCNT is supplied with the command signal CMD02 and generates the corresponding supply voltage therewith as N02. The substrate bias controlling circuit VBBCNT is supplied with the command signal CMD03 and generates the corresponding substrate voltage therewith as N03 and N04 for the MOS transistor substrate (or well).

The main circuit LSI is supplied with the clock signal N01, the supply voltage N02 and the substrate biases N03 and N04 and performs the operation or the signal processing according to those signals. As shown in FIG. 1, the main circuit LSI is generally composed of a register REG01 or REG02 and a logic circuit LOG or a memory circuit (not shown) and so forth. The operation of the register REG01 or REG02 is determined by the clock period of the clock signal N01, the supply voltage N02, and the substrate biases N03 and N04. The operating speed of the logic circuit LOG is determined by the supply voltage N02 and the substrate biases N03 and N04. The logic circuit LOG serves to process the data signal DAT01 to be inputted through the register REG01 and to output the data signal DAT02 through the register REG02.

Figure 3:
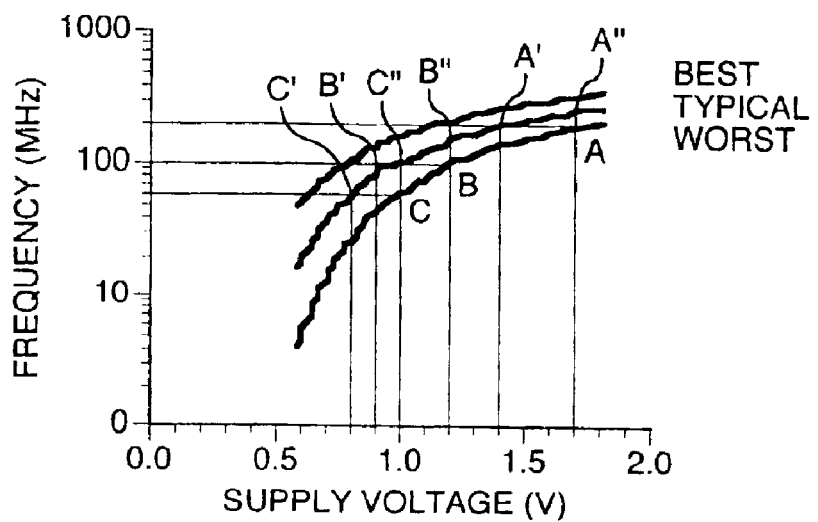
FIG. 3 is a graph showing dependence of a supply voltage on an operating frequency of a CMOS circuit.

The operating speed of the CMOS circuit is made variable depending on variations in the manufacturing process, fluctuations in supply voltage, change of an operating temperature, and so forth. The operations speed thereof corresponding to the set value is assumed to be a typical speed. On this assumption, the operating speed in the condition where the high speed is achieved is referred to as the best speed and the operating speed in the condition where the lowest speed takes place is referred to as the worst speed. FIG. 3 shows the dependency of a supply voltage on the fluctuation in the operating speed of the CMOS circuit, that is, the operating frequency. As is obvious from FIG. 3, the operating speed of the CMOS circuit fluctuates in the range of the best to the worst. This range is spread more as the supply voltage is made lower. In the present invention, the substrate bias of the CMOS circuit is adjusted. By this adjustment, the characteristic variations in the range from the worst to the best as shown in FIG. 3 may be arranged to the set value (typical) so that the performance of the CMOS circuit may be improved.

For example, the main circuit LSI operating on an A point (worst) is controlled through the substrate bias so that it may be operated on an A' point (typical). In this case, the supply voltage may be lowered as keeping the same operating speed or processing speed, thereby greatly reducing the power consumption. Alternatively, the main circuit LSI that is operating on the A point (worst) is controlled through the substrate bias so that it may be operated on an A" point. Also in this case, the operating speed may be raised as keeping the same supply voltage or power consumption. By controlling the substrate bias, the operating clock frequency and the supply voltage as mentioned above, the control point A, B or C of the main circuit LSI may be shifted to the control point A', B' or C' for lowering the power consumption or the control point A", B" or C" for enhancing the operating speed.

The chart of FIG. 2 indicates the numeric values of that effect as shown in FIG. 3. In the conventional control based on the clock frequency and the supply voltage, when the clock signal frequency FRQ is selected as 200 MHz, 100 MHz or 50 MHz, the supply voltage is determined as 1.7 V, 1.2 V or 1.0 V. On the other hand, in the control based on the substrate bias, the supply voltage may be lowered into 1.4 V, 0.9 V or 0.8 V. This makes it possible for the main circuit LSI to lower the power consumption than the conventional control technology.

As the substrate bias, it is possible to apply a range from the forward bias to the back bias. The forward bias means that the substrate (well) of the MOS transistor composing the CMOS circuit is biased in the forward direction. That is, it means that for the PMOS transistor, a lower voltage than the voltage of a source terminal is applied, while for the NMOS transistor, a higher voltage than the voltage of the source terminal is applied. The back bias means that the substrate of the MOS transistor is biased in the back direction. That is, it means that for the PMOS transistor, a higher voltage than the voltage of the source terminal is applied, while for the NMOS transistor, a lower transistor than the voltage of the source terminal is applied. The change of the substrate bias from the back bias to the forward bias is called "to apply high substrate bias", while the change of the substrate bias from the forward bias to the back bias is called "to apply low substrate bias".

One of the indexes for indicating the switching speed of the MOS transistor is a threshold voltage. When the high substrate bias is applied, the absolute value of the threshold voltage is made lower, while when the low substrate bias is applied, the absolute value of the threshold voltage is made higher. The CMOS circuit composed of the MOS transistor with a low threshold voltage is operated at a high speed, while the COMS circuit composed of the MOS transistor with a high threshold voltage is operated at a low speed. Hence, the substrate bias is heightened to the forward bias in which the CMOS circuit is operated faster, while the substrate bias is lowered to the back bias in which the CMOS circuit is operated slower.

Figure 4:
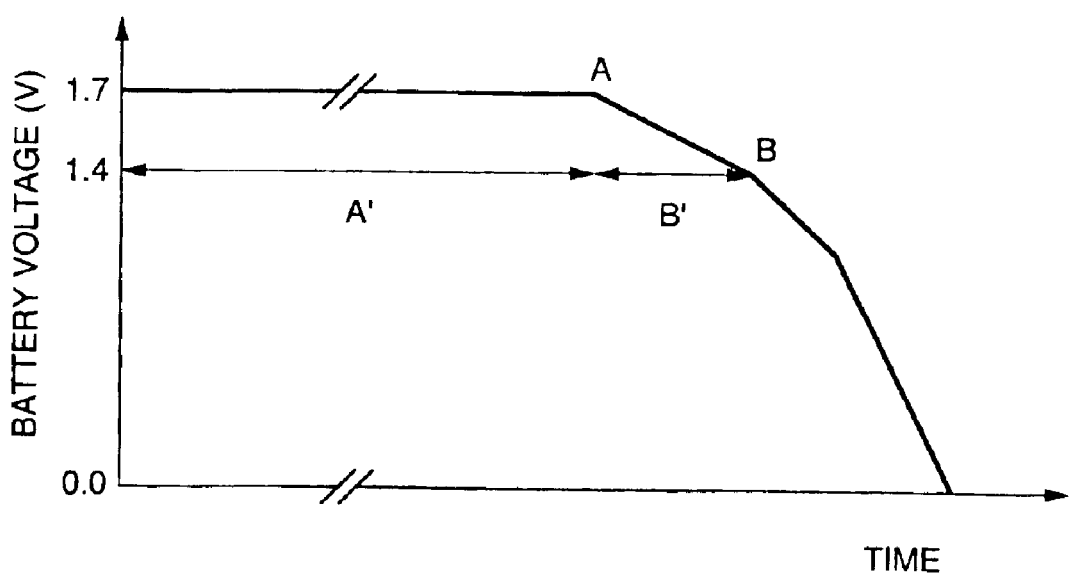
FIG. 4 is a graph showing a relation between a battery voltage and a time when powered by a battery.

The relation between a time and a voltage to be supplied by a battery in the case that the main circuit LSI is powered by the battery is shown in FIG. 4. In the conventional technology, when the main circuit LSI is requested to be operated at the best speed, it is stopped when the supply voltage becomes lower than 1.7 V. That is, the main circuit LSI cannot be used until the point A shown in FIG. 4. According to this invention, however, by applying the forward bias to the substrate, the same operating speed can be realized at the supply voltage of 1.4 V. Hence, it can be used until the point B shown in FIG. 4. Further, if it is used at the voltage of 1.4 V, the main circuit LSI may be operated for a longer length of time at the point A' and a further length of B'. It means that the battery life is greatly extended.

The command generating circuit OP operates to generate a command signal so that the maximum operating performance be realized depending on a command from the operating system, a command from the application software, a signal input according to the mode from the outside of the device, a signal input from the memory such as ROM or FLASH, the amount of data to be processed by the main circuit LSI, that is, the amount of the processing load. Further, if it is powered by the battery, the control is changed according to the remaining quantity of the battery and the speed is made lower so that the battery life is extended accordingly.

As described above, the command generating circuit OP, the clock frequency control circuit FRQCNT, the power supply control circuit VDDCNT, and the substrate bias control circuit VBBCNT may be mounted on the same chip as the main circuit LSI or on another chip. This holds true to the following embodiments.

Figure 5:
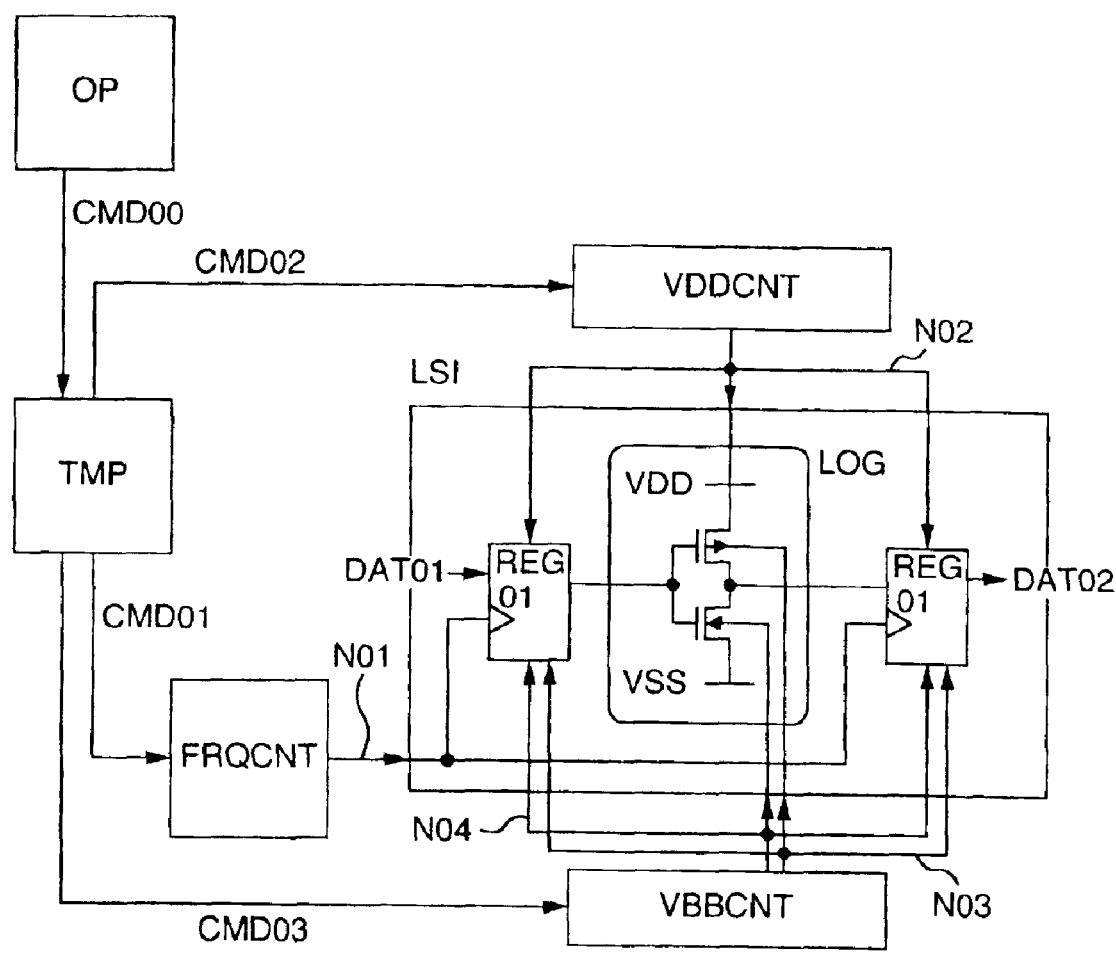
FIG. 5 is a diagram showing another embodiment of the present invention.

FIG. 5 is a block diagram showing another embodiment of the present invention.

The semiconductor integrated circuit device according to the present invention is arranged to have a main circuit LSI that is a semiconductor integrated circuit such as a microprocessor composed of a CMOS circuit, a command generating circuit OP, a temperature compensation circuit TMP, a clock frequency control circuit FRQCNT, a power supply control circuit VDDCNT, and a substrate bias control circuit VBBCNT. The temperature compensation circuit TMP has a temperature measuring function and a command generating function. A command signal CMD00 outputted from the command generating circuit OP is given to the temperature compensation circuit TMP. Then, the circuit TMP operates to output command signals CMD01, CMD02 and CMD04 according to the operating temperature at the measurement. The clock frequency control circuit FRQCNT is supplied with the command signal CMD01 and generates the clock signal of the corresponding frequency therewith as N01. The power supply control circuit VDDCNT is supplied with the command signal CMD02 and generates the corresponding supply voltage therewith as N02. The substrate bias control circuit VBBCNT is supplied with the command signal CMD03 and generates the corresponding the substrate voltage therewith as N03 and N04 for the MOS transistor substrates. The main circuit LSI is supplied with the clock signal N01, the supply voltage N02 and the substrate biases N03 and N04 and performs the corresponding operation or signal treatment therewith. As shown in FIG. 1, generally, the main circuit LSI is composed of a register REG01 or REG02, a logic circuit LOG, a memory circuit or the like. The operation of the register REG01 or REG02 is determined by the clock period of the clock signal N01, the supply voltage N02 and the substrate biases N03 and N04. The operating speed of the logic circuit LOG is determined by the supply voltage N02 and the substrate biases N03 and N04. The logic circuit LOG processes the data signal DAT01 or DAT02.

The operating speed is, as shown in FIG. 3, changed when the temperature is changed because of the heating caused in the operation of the main circuit or the like. Hence, it is necessary to change the operation point according to the temperature. By converting the command signal through the temperature compensation circuit TMP, the operation point is changed so that the optimum control signal may be constantly supplied to the main circuit LSI.

Figure 6:
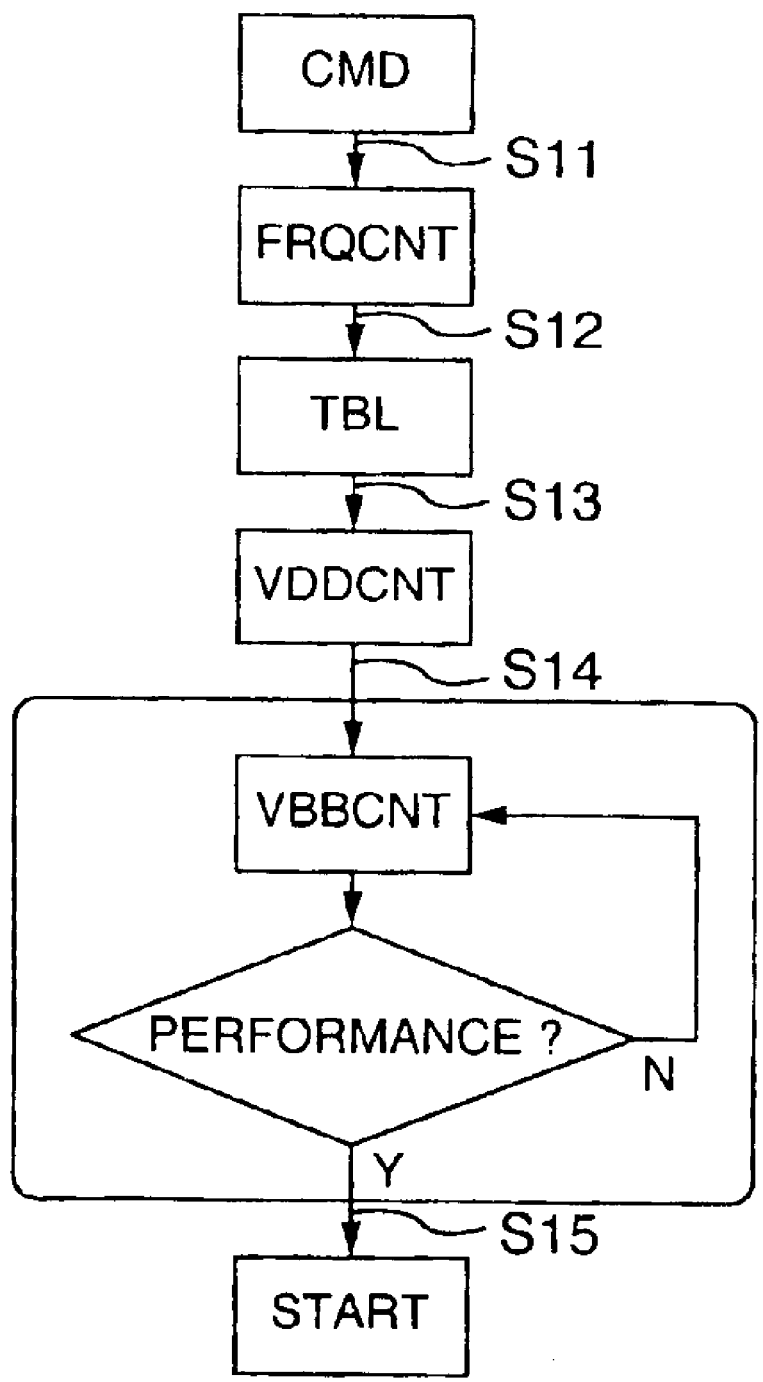
FIG. 6 is a flowchart showing another embodiment of the present invention.

FIG. 6 is a flowchart showing another embodiment of the present invention.

When the command CMD is generated, at first, the operating frequency is determined for meeting the performance requested by the command CMD. Then, the clock frequency controlling circuit FRQCNT generates a clock signal with a predetermined frequency. The possible lowest supply voltage for enabling the operation based on that clock frequency is generated on a frequency/supply voltage correspondence table TBL by means of the power supply controlling circuit VDDCNT. Lastly, the substrate bias controlling circuit VBBCNT selects the optimum substrate bias so that the main circuit meets the requested performance, based on the clock signal and the supply voltage. When the optimum substrate bias is selected, the main circuit starts its operation. The clock signal frequency and the supply voltage are simultaneously determined on the correspondence table TBL stored in the storage unit like a memory in accordance with the command CMD. Then, the substrate bias is being adjusted as feeding back the data as to whether or not the operation of the main circuit may meet the requested performance. This adjustment results in realizing the operation at the possible lowest power consumption as meeting the requested performance.

Figure 7:
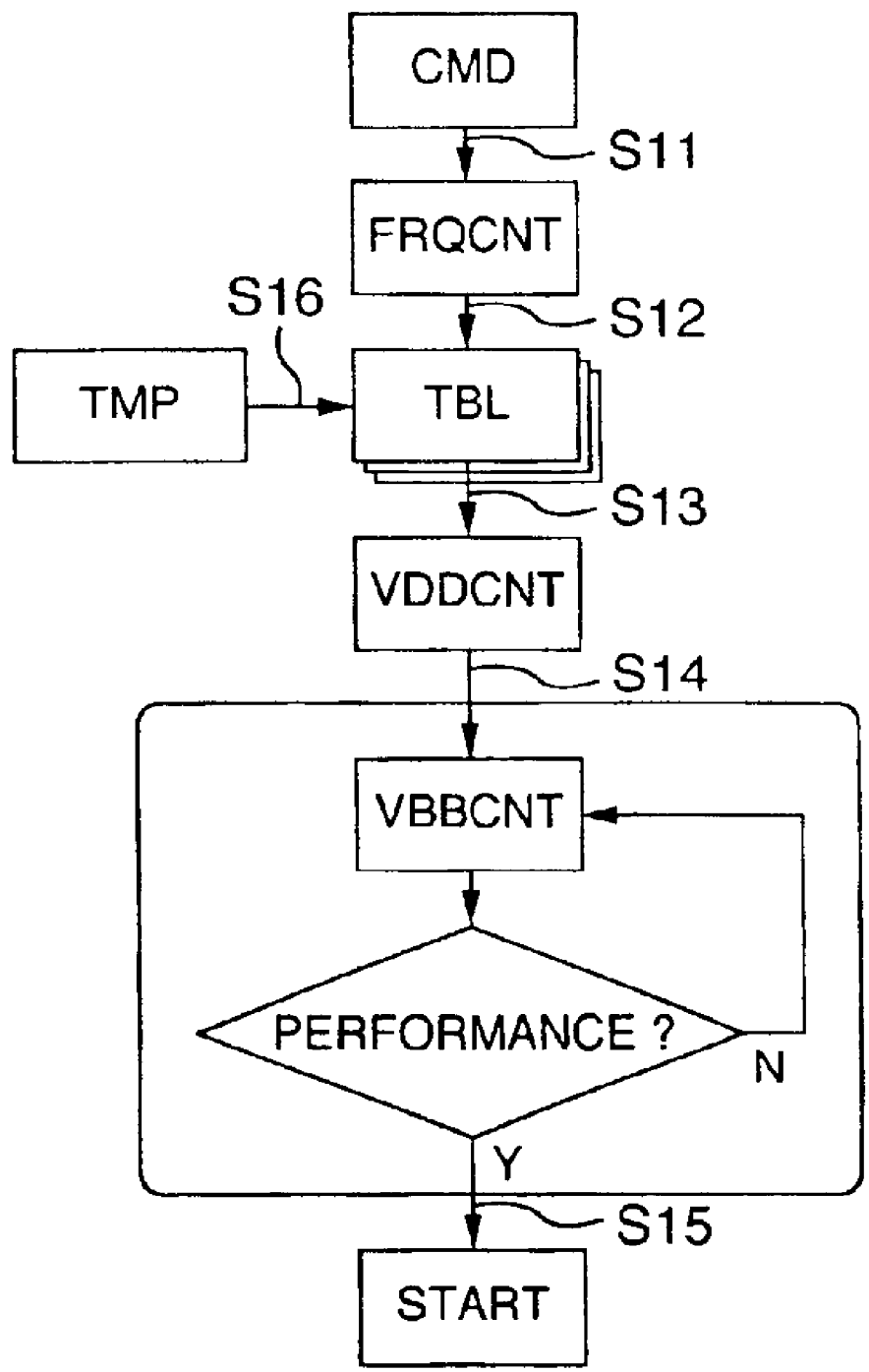
FIG. 7 is a flowchart showing another embodiment of the present invention.

FIG. 7 is a flowchart showing another embodiment of the present invention.

When a command CMD is generated, at first, an operating frequency for meeting the performance requested by the command CMD is determined. Then, the clock frequency controlling circuit FRQCNT generates the clock signal with a predetermined frequency. The possible lowest supply voltage for enabling the operation based on this clock frequency is generated on the frequency/supply voltage correspondence table TBL by means of the power supply controlling circuit VDDCNT. At a time, the temperature information TMP is given to the correspondence table TBL. The frequency/supply voltage relation indicated in the correspondence table TBL is changed according to this temperature information TMP. Lastly, the substrate bias controlling circuit VBBCNT selects the optimum substrate bias so that the main circuit meets the requested performance, based on the clock signal and the supply voltage. When the optimum substrate bias is selected, the main circuit starts its operation. The clock signal frequency and the supply voltage are simultaneously determined on the correspondence table TBL stored in a storage medium like a memory in accordance with the command CMD. Then, the substrate bias is being adjusted as feeding back the data as to whether or not the operation of the main circuit may meet the requested performance. This adjustment results in realizing the operation at the possible lowest power consumption as meeting the requested performance. The correspondence table TBL is converted according to the temperature information TMP so that more detailed control may be made possible.

Figure 8:
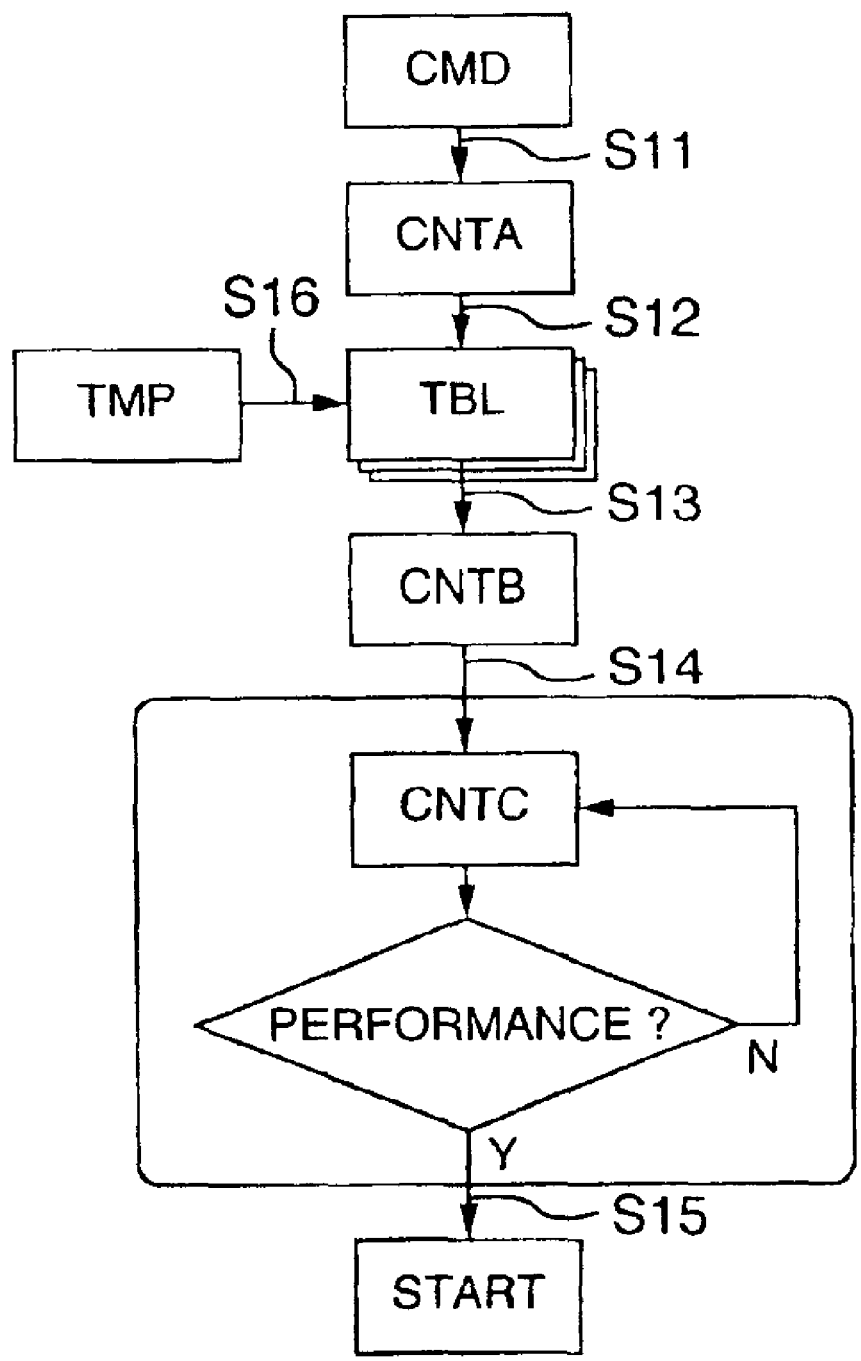
FIG. 8 is a flowchart showing another embodiment of the present invention.

FIG. 8 is a flowchart showing another embodiment of the present invention.

In the flowcharts of FIGS. 6 and 7, the control sequence of the clock frequency controlling circuit FRQCNT, the power supply controlling circuit VDDCNT and the substrate bias controlling circuit VBBCNT is not in order. It may be changed according to the purpose. It means that any one of the clock frequency controlling circuit FRQCNT, the power supply controlling circuit VDDCNT and the substrate bias controlling circuit VBBCNT may be applied to the control means CNTA, CNTB or CNTC shown in FIG. 8. For example, in the case of enhancing the operating speed without raising the power consumption, the control sequence may be determined in order of the supply voltage, the substrate bias and the clock frequency.

Figure 9:
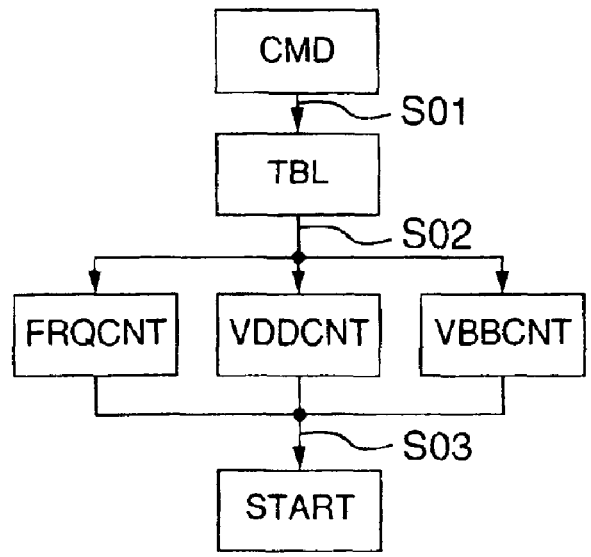
FIG. 9 is a flowchart showing another embodiment of the present invention.

FIG. 9 is a flowchart showing another embodiment of the present invention.

When a command CMD is generated, the operating frequency, the supply voltage and the substrate bias are determined on the frequency/supply voltage/substrate bias correspondence table TBL. Then, the clock frequency controlling circuit FRQCNT, the power supply controlling circuit VDDCNT and the substrate bias controlling circuit VBBCNT are served to generate the predetermined clock signal, supply voltage and substrate bias, respectively. Afterwards, the main circuit starts its operation. The clock signal frequency, the supply voltage and the substrate bias are simultaneously determined on the correspondence table TBL stored in a storage medium like a memory in accordance with the command CMD. The correspondence table TBL is pre-set so that the main circuit may meet the requested performance. In the setting, it may be set so that the power consumption may be suppressed to a minimum in the range that the proper operation speed is met or so that the operation sped may be enhanced to a maximum in the range that the proper power consumption is met.

Figure 10:
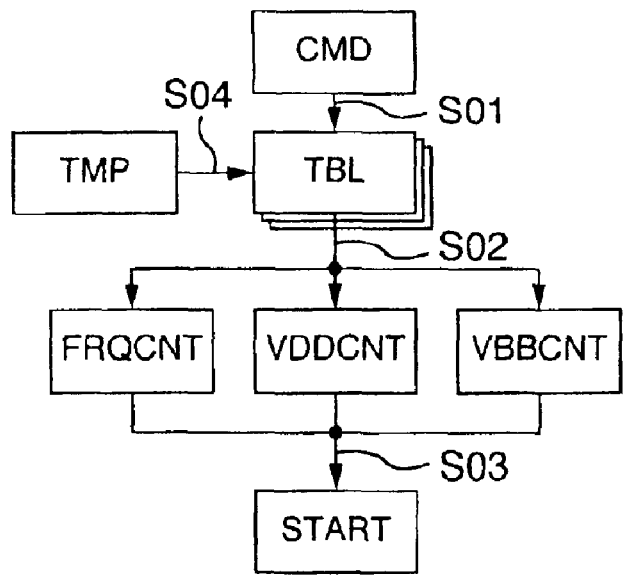
FIG. 10 is a flowchart showing another embodiment of the present invention.

FIG. 10 is a flowchart showing another embodiment of the present invention.

When a command CMD is generated, the operating frequency, the supply voltage and the substrate bias are determined on the frequency/supply voltage/substrate bias correspondence table TBL. Then, the clock frequency controlling circuit FRQCNT, the power supply controlling circuit VDDCNT, and the substrate bias controlling circuit VBBCNT are served to generate the predetermined clock signal, supply voltage, and substrate bias, respectively. At a time, the temperature information TMP is given to the correspondence table TBL. The frequency/supply voltage/ substrate bias relation indicated in the correspondence table TBL may be changed according to this temperature information TMP. Afterwards, the main circuit starts its operation. The clock signal frequency, the supply voltage and the substrate bias are simultaneously determined on the correspondence table TBL stored in a storage medium like a memory in accordance with the command CMD. The correspondence table TBL is pre-set so that the main circuit may meet the requested performance. In this setting, it may be set so that the power consumption may be suppressed into a minimum in the range that the proper operating speed is met or so that the operating speed may be enhanced into a maximum in the range that the proper power consumption is met. The correspondence table TBL is converted into the temperature information TMP so that more detailed control is made possible.

Figure 11:
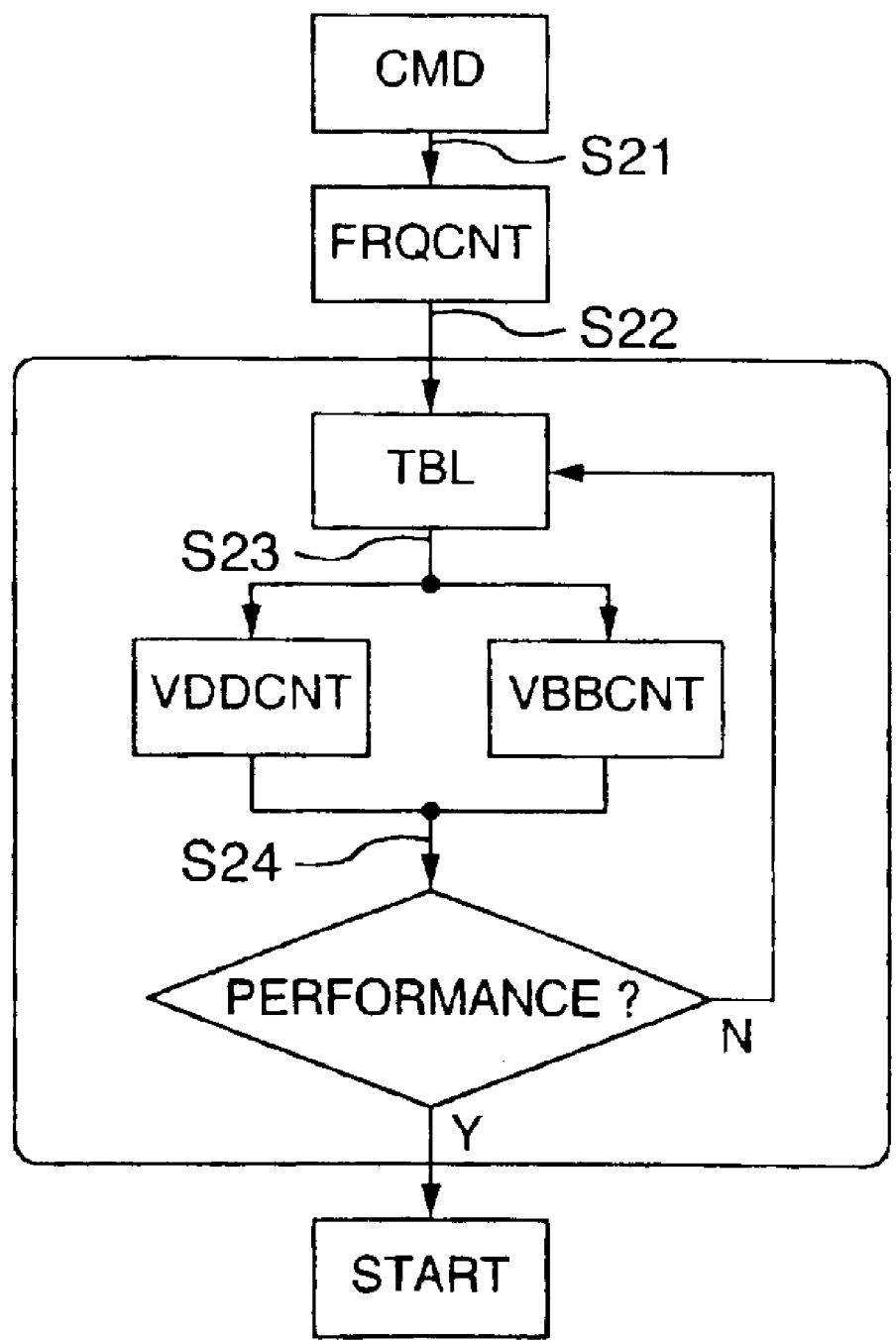
FIG. 11 is a flowchart showing another embodiment of the present invention.

FIG. 11 is a flowchart showing another embodiment of the present invention.

When a command CMD is generated, at first, the operating frequency for enabling the command CMD to meet the requested performance is determined. Then, the clock frequency controlling circuit FRQCNT generates the clock signal with a predetermined frequency. Afterwards, the power supply controlling circuit VDDCNT and the substrate bias controlling circuit VBBCNT are served to select the most suitable combination of the supply voltage and the substrate bias so that the main circuit may meet the requested performance, based on the clock signal. In selecting both the supply voltage and the substrate bias, the combination of the supply voltage and the substrate bias is selected on the supply voltage/substrate bias correspondence table TBL. When the most suitable combination of the supply voltage and the substrate bias is selected, the main circuit starts its operation. The clock signal frequency is determined in accordance with the command CMD. Then, the supply voltage and the substrate bias are simultaneously selected on the correspondence table TBL stored in a storage medium like a memory. The alternatives are being adjusted as feeding back the data as to whether or not the operation of the main circuit may meet the requested performance. This adjustment results in realizing the operation in which the power consumption is suppressed to a minimum as meeting the requested performance.

Figure 12:
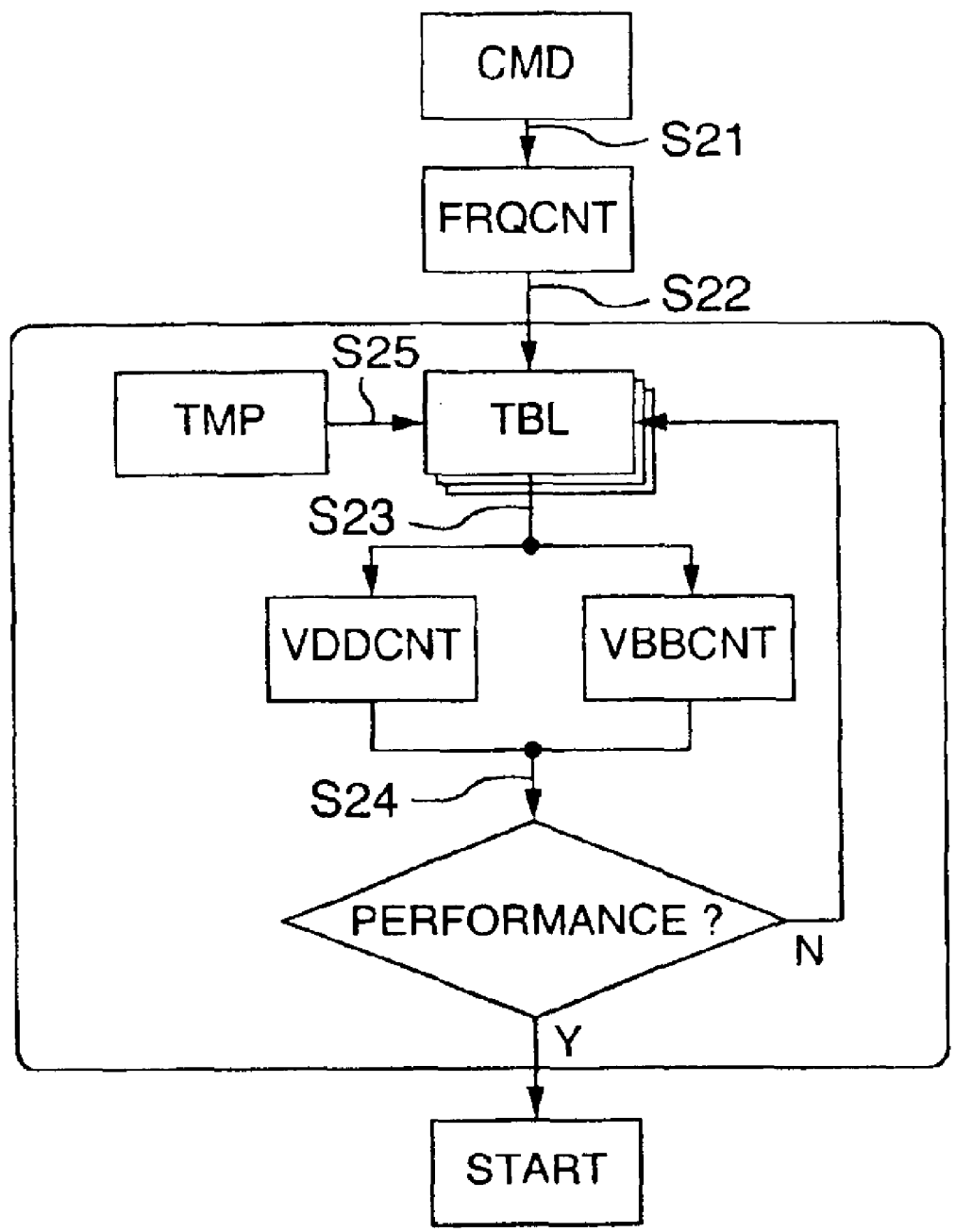
FIG. 12 is a flowchart showing another embodiment of the present invention.

FIG. 12 is a flowchart showing another embodiment of the present invention.

When a command CMD is generated, at first, an operating frequency for meeting the performance requested by the command CMD is determined. Then, the clock frequency controlling circuit FRQCNT generates the clock signal with a predetermined frequency. Afterwards, based on the clock signal, the power supply controlling circuit VDDCNT and the substrate bias controlling circuit VBBCNT are both served to select the most suitable combination of the supply voltage and the substrate bias so that the main circuit may meet the requested performance. In selecting both, the combination of the supply voltage and the substrate bias is selected on the supply voltage/substrate bias correspondence table TBL. At a time, the temperature information TMP is given to the correspondence table TBL. The supply voltage/substrate bias relation indicated in the correspondence table TBL may be changed according to the temperature information TMP. When the most suitable combination of the supply voltage and the substrate bias is selected, the main circuit starts its operation. The clock signal frequency is determined in accordance with the command CMD. Afterwards, the supply voltage and the substrate bias are simultaneously selected on the correspondence table TBL stored in a storage medium like a memory. The alternatives are being adjusted as feeding back the data as to whether or not the operation of the main circuit may meet the requested performance. This adjustment results in realizing the operation at the possible lowest power consumption as meeting the requested performance. The correspondence table TBL may be converted according to the temperature information TMP so that more detailed control is made possible.

Figure 13:
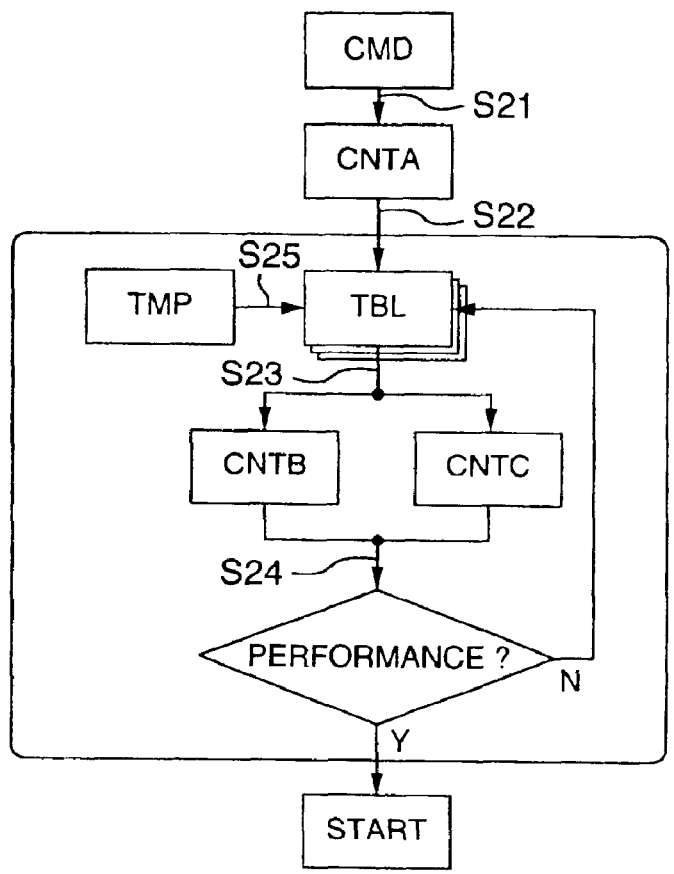
FIG. 13 is a flowchart showing another embodiment of the present invention.

FIG. 13 is a flowchart showing another embodiment of the present invention.

In the flowcharts of FIGS. 11 and 12, the control sequence of the clock frequency controlling circuit FRQCNT, the power supply controlling circuit VDDCNT, and the substrate bias controlling circuit VBBCNT is not in order. It may be changed according to the purpose. It means that any one of the clock frequency controlling circuit FRQCNT, the power supply controlling circuit VDDCNT and the substrate bias controlling circuit VBBCNT may be applied to the control means CNTA, CNTB or CNTC shown in FIG. 13, respectively. For example, in the case of enhancing the operating speed without higher power consumption, the control should be determined so that the control means CNTA may be the supply voltage controlling circuit VDDCNT and the other control means may be the substrate bias controlling circuit VBBCNT and the clock frequency controlling circuit FRQCNT.

Figure 14:
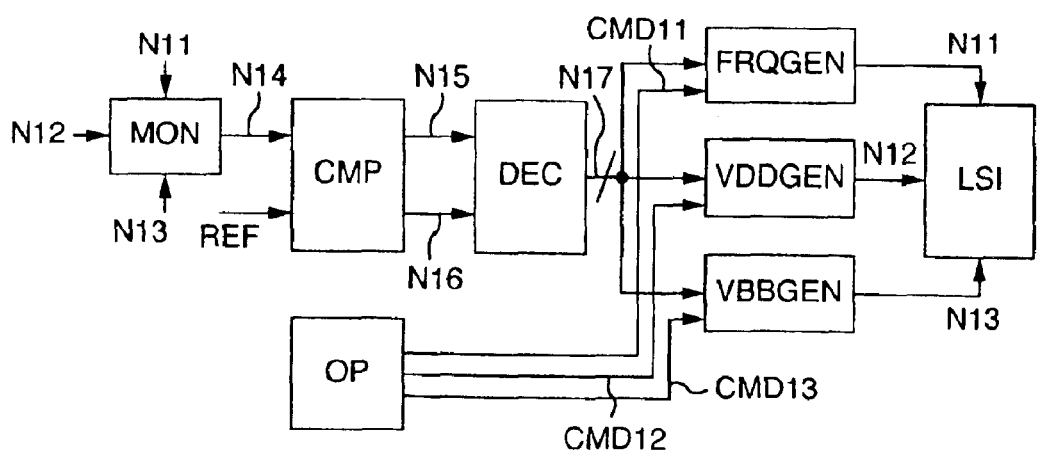
FIG. 14 is a block diagram showing another embodiment of the present invention.

FIG. 14 shows another embodiment of the present invention.

According to another embodiment of the invention, the semiconductor integrated circuit device is arranged to have a monitor MON, a comparator CMP, a decoder DEC, a command generating circuit OP, a clock signal generating circuit FRQGEN, a power supply generating circuit VDDGEN, a substrate bias generating circuit VBBGEN and a main circuit LSI. The monitor MON is supplied with a clock signal N11 generated by the clock generating circuit FRQGEN, a supply voltage N12 generated by the power supply generating circuit VDDGEN, and a substrate bias N13 generated by the substrate bias generating circuit and then outputs a monitor signal N14. The comparator CMP operates to compare the monitor signal N14 with a reference signal REF and then output a down signal N16 if the monitor signal N14 is faster than the reference signal or an up signal N15 if vice versa. The decoder DEC is inputted with the up signal N15 and the down signal N16, decodes these signals and then output a decoder signal N17. The clock signal generating circuit FRQGEN, the power supply generating circuit VDDGEN, and the substrate bias generating circuit VBBGEN are inputted with the decoder signal N17 and the command signals CMD11, CMD12 and CMD13 outputted by the command generating circuit OP, generates the clock signal N11, the supply voltage N12 and the substrate N13 according to these signals, and then supply them to the main circuit LSI and the monitor MON.

Figure 15:
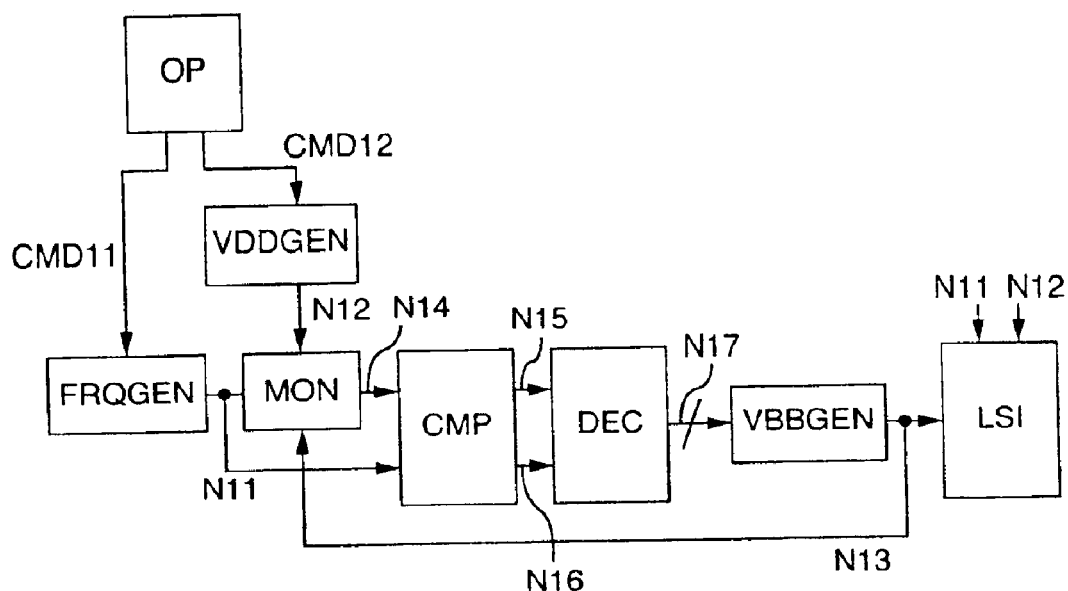
FIG. 15 is a block diagram showing another embodiment of the present invention.

In the embodiment based on the flowchart described with reference to FIGS. 6 and 7, the command generating circuit OP generates the command signals CMD11 and CMD12 and then determines the output N11 of the clock signal generating circuit FRQGEN and the output N12 of the power supply generating circuit VDDGEN according to these command signals. Then, a decode signal N17 is nullified to these generating circuits. Further, no command signal N13 is allowed to output, and the substrate bias generating circuit VBBGEN and its output N13 are controlled by the decode signal N17. FIG. 15 shows the details of the operation.

As shown in FIG. 15, the monitor MON and the main circuit LSI are supplied with the output clock signal N11 of the clock signal generating circuit FRQGEN and the output voltage N12 of the power supply generating circuit VDDGEN, which are determined in accordance with the command signals CMD11 and CMD12 outputted from the command generating circuit OP. The monitor MON is served to delay the clock signal N11 and then output it as a monitor signal N14. The comparator CMP compares the clock signal N11 with the monitor signal N14 for determining if the delay time of the monitor MON is faster or slower than a design value. If the monitor MON is delayed further than the value in design, the comparator CMP is served to output an up signal N15, while if vice versa, it outputs a down signal N16. The decoder operates to decode the up signal N15 and the down signal N16 for generating a decoder signal N17. The decoder signal N17 is inputted into the substrate bias generating circuit VBBGEN. The substrate bias N13 is fed back to the monitor so that when the up signal N15 is generated, the low substrate bias is applied, while when the down signal N16 is generated, the high substrate bias is applied.

In general, the CMOS circuit enables to control the threshold voltage of the MOS transistor through the use of the substrate bias. It means that the operating speed of the CMOS may be changed by the substrate bias. When a low substrate bias is applied, the MOS transistor has a higher threshold voltage, so that the operating speed of the CMOS circuit is low. Conversely, when a high substrate bias is applied, the threshold voltage of the MOS transistor is made lower, so that the operating speed of the CMOS circuit is made low. By repeating this feedback control, the substrate bias N13 is controlled so that the delay time of the monitor MON may be changed into a predetermined value according to the clock signal N11 and the supply voltage N12. This substrate bias is supplied to the main circuit LSI as well. The operating speed of the main circuit is thus also adjusted into the most approximate value.

In the embodiment based on the flowchart of FIG. 8, the command generating circuit OP generates two signals of the command signals CMD11, CMD12 and CMD13 and then determines two control signals of the output N11 of the clock signal generating circuit FRQGEN, the output N12 of the power supply generating circuit VDDGEN and the output N13 of the substrate bias controlling circuit VBBGEN. Then, the decode signal N17 is nullified to these two selected generating circuits. Further, no remaining command signal is outputted. The remaining control circuits and their outputs are controlled by the decode signal N17.

Figure 16:
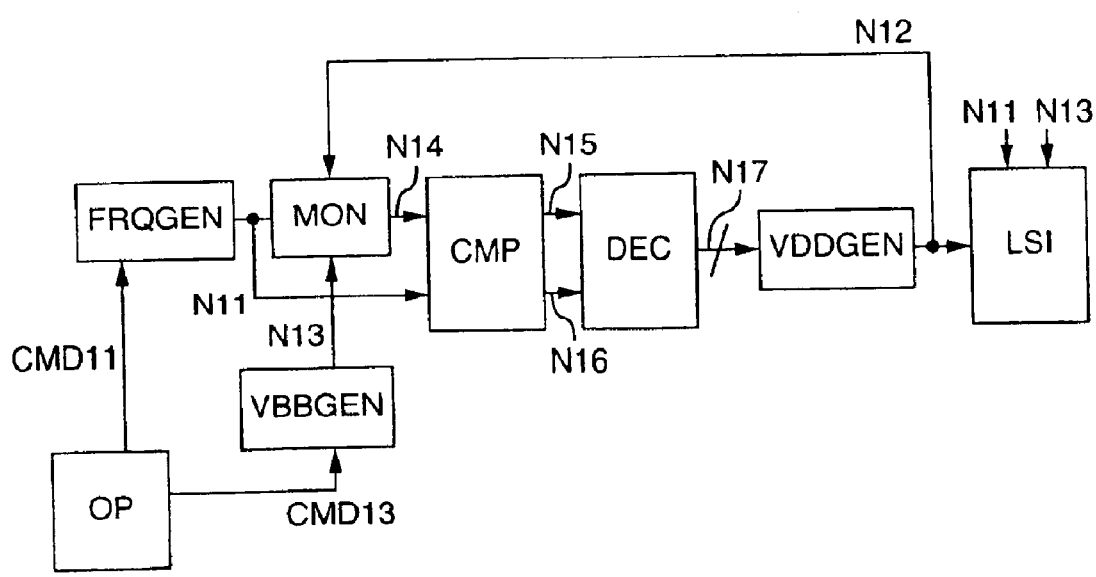
FIG. 16 is a block diagram showing another embodiment of the present invention.
Figure 17:
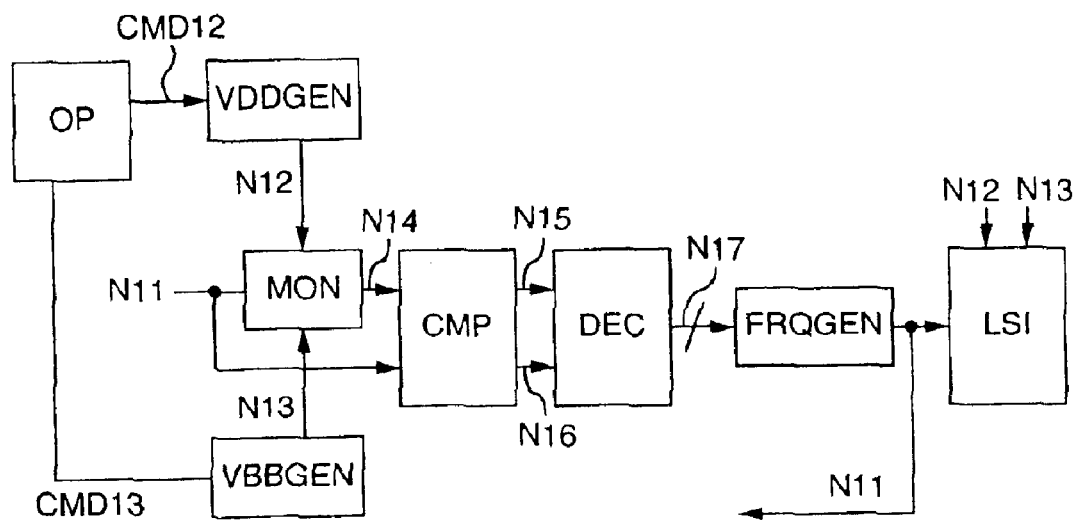
FIG. 17 is a block diagram showing another embodiment of the present invention.

FIGS. 15 to 17 show the details of the foregoing operation. In FIG. 15, as described above, the clock signal generating circuit GRQGEN and the power supply generating circuit VDDGEN are selected by the command generating circuit OP, and the substrate bias generating circuit VBBGEN is controlled in a feedback manner so that the operating speeds of the monitor MON and the main circuit LSI are adjusted to the most approximate speed. In FIG. 16, likewise, the clock signal generating circuit FRQGEN and the substrate bias generating circuit VBBGEN are-selected by the command generating circuit OP. The power supply generating circuit VDDGEN is controlled in a feedback manner so that the operating speeds of the monitor MON and the main circuit LSI are adjusted to the most approximate speeds. In FIG. 17, likewise, the power supply generating circuit VDDGEN and the substrate bias generating circuit VBBGEN are selected by the command generating circuit OP, and the clock signal generating circuit FRQGEN is controlled in a feedback manner so that the operating speeds of the monitor MON and the main circuit LSI may be adjusted to the most approximate speeds.

Figure 18:
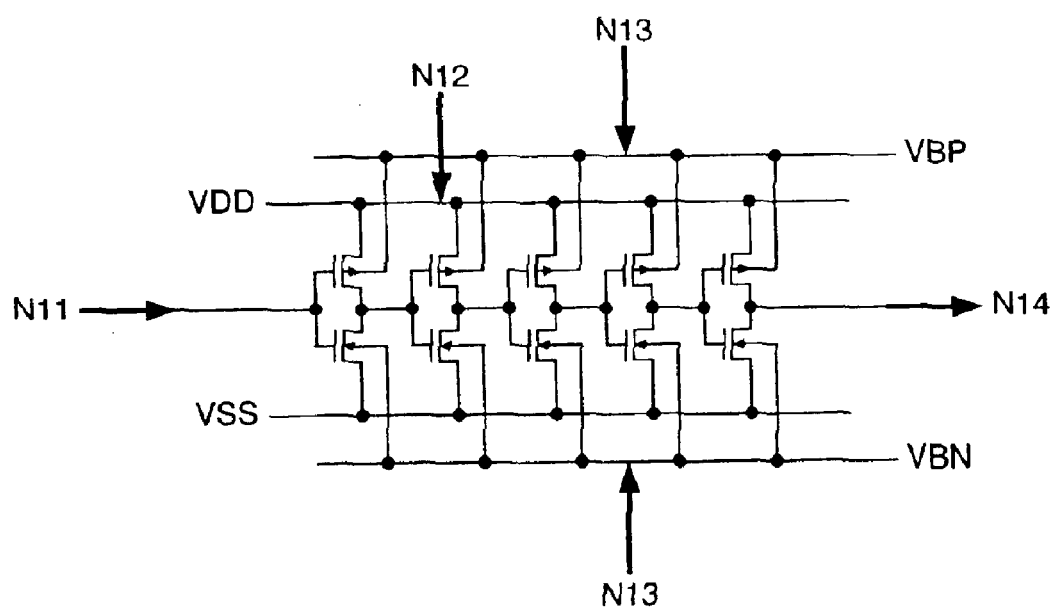
FIG. 18 is a diagram showing an embodiment of a monitoring circuit.

FIG. 18 shows an embodiment of the monitor.

The monitor takes a structure wherein the inverters each composed of a CMOS are connected in series. The delay time when any signal is conveyed from the input N11 to the output N14 of the monitor may be changed by the supply voltage N12 and the substrate bias N13 given by the CMOS circuit. As the supply voltage N12 is made higher, the delay time of the monitor is made shorter, and vice versa. As the applied substrate bias N13 is made lower, the delay time of the monitor is made longer, and vice versa. Herein, the application of the low substrate bias means that the substrate bias VBP for the PMOS transistor is higher than the supply voltage VDD and the substrate bias VBN for the NMOS transistor is lower than the ground voltage VSS. The application of the high substrate bias means that the substrate bias VBP for the PMOS transistor is lower than the supply voltage VDD and the substrate bias VBN for the NMOS transistor is higher than the ground voltage VSS.

Figure 19:
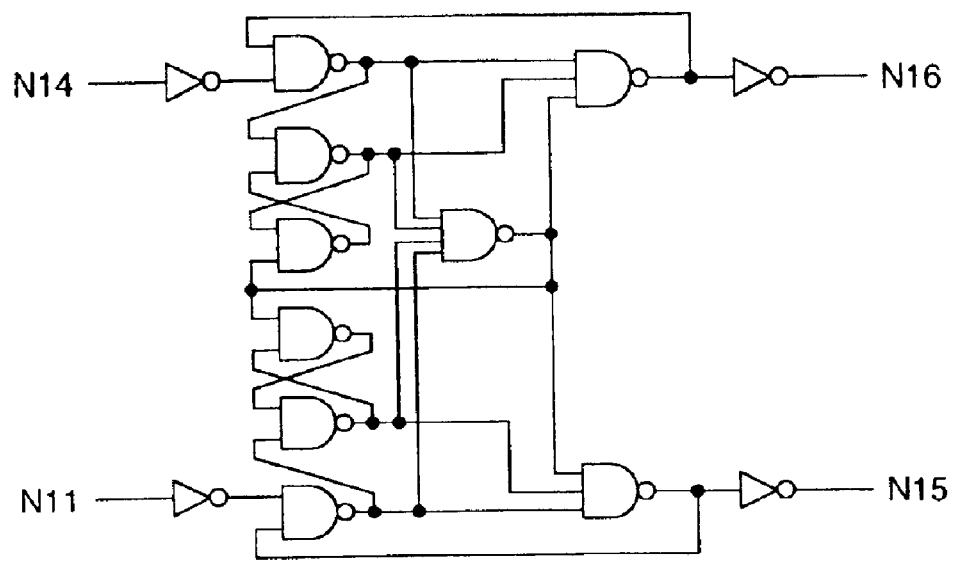
FIG. 19 is a diagram showing an embodiment of a comparator circuit.

FIG. 19 shows an embodiment of the comparator.

The comparator operates to compare the input signal N14 with the other input signal N11 in frequency and phase. If the signal N14 is slower than the signal N11, the comparator outputs an up signal N15, while if vice versa, it outputs a down signal N16.

Figure 20:
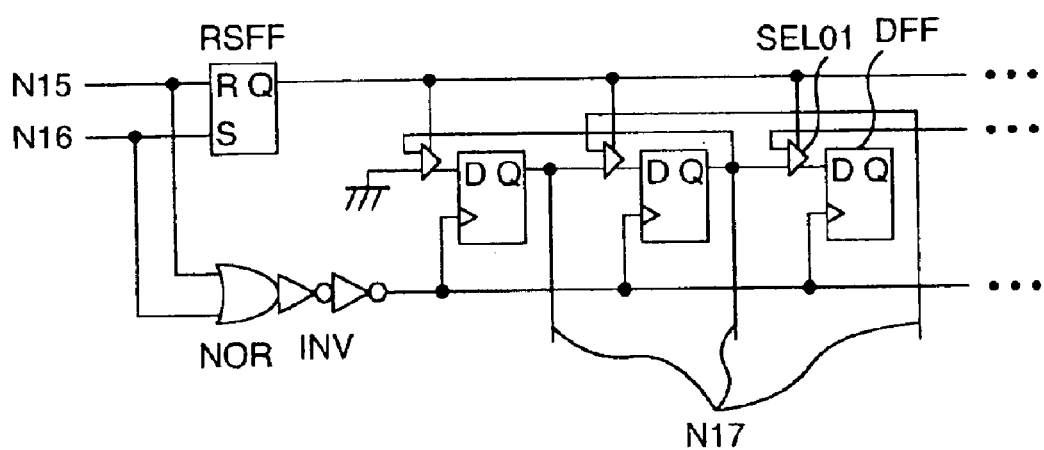
FIG. 20 is a diagram showing an embodiment of a decoder circuit.

FIG. 20 shows an embodiment of a decoder. The decoder is composed of a RS type flip-flop circuit RSFF, a D-type flip-flop circuit DFF, a selector SEL01, a NOR circuit NOR, and an inverter INV. Of the Q signal output N17 of the D-type flip-flop DFF, only one signal is at high level and the remaining signals are at low level. When the up signal N15 is inputted to the decoder, the high output position of the signal N17 is shifted by one position from the left to the right hand as viewed in FIG. 20. When the down signal N16 is inputted thereto, the high output position of the signal N17 is shifted by one position from the right to the left hand as viewed in FIG. 20. It means that the decoder shown in FIG. 20 is an up-down shift register.

Figure 21:
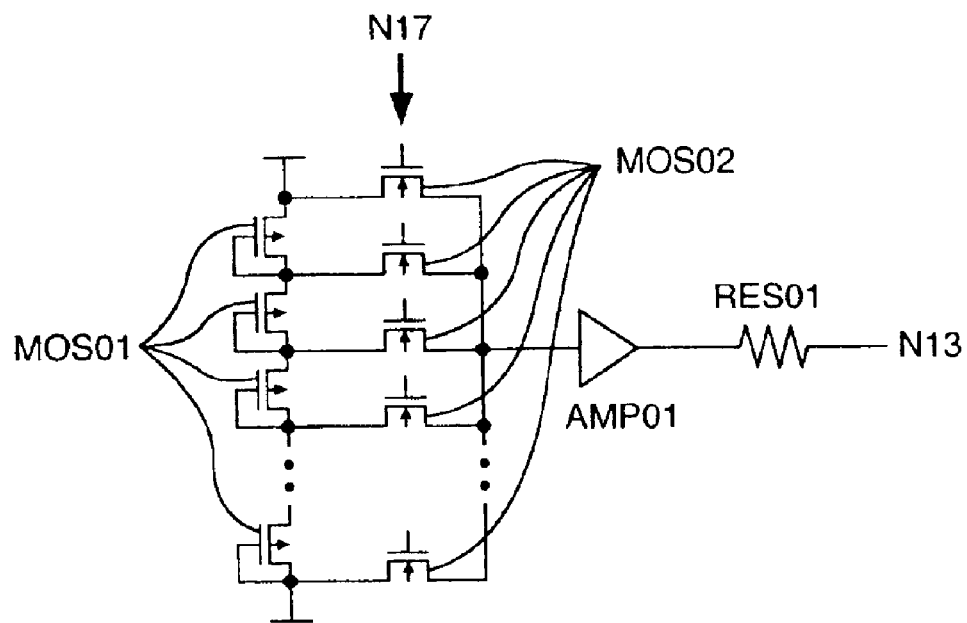
FIG. 21 is a diagram showing an embodiment of a supply voltage generating circuit or a substrate bias generating circuit.

FIG. 21 shows an embodiment of the power supply generating circuit or the substrate bias generating circuit. The power supply generating circuit or the substrate bias generating circuit is composed of MOS transistors MOS01 connected in series, MOS transistors MOS02 served as switches for each of the voltages, an amplifier AMP01 for amplifying current, and a resistor RES01 for limiting the current. The MOS transistors MOS01 connected in series are served to divide the inputted voltages through the resistance of each transistor for creating a plurality of voltage values. The terminal of the MOS transistor MOS01 for generating a target voltage is connected with the MOS transistor MOS02 for switching. The gate terminal of the MOS02 is connected to the decoder signal N17. One of the voltages generated by the MOS01 is selected by the signal selected by the decoder circuit and then is outputted through the MOS02. The voltage outputted from the MOS02 is current-amplified by the amplifier AMP01 for obtaining the necessary current to the supply voltage and the substrate bias. This operation makes it possible to control the voltages generated by the power supply generating circuit and the substrate bias generating circuit through the use of the decoder signal N17.

As the substrate bias generating circuit two types of the circuit shown in FIG. 21 are required, each of which is used for the PMOS transistor substrate and the NMOS transistor substrate. The resistor RES01 for limiting the current suppresses the increase of the leak current and thereby improves the operating reliability of the main circuit if the substrate bias generating circuit supplies the forward bias voltage.

Figure 22:
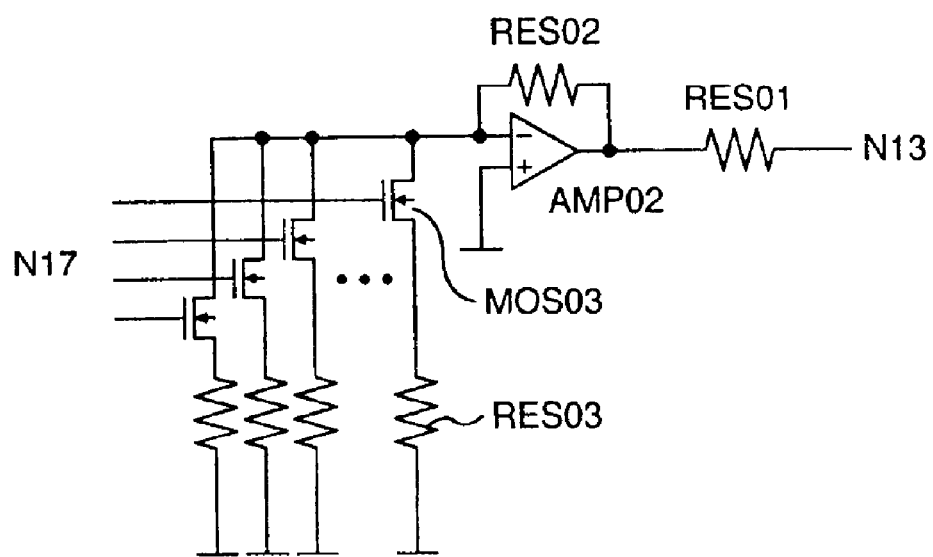
FIG. 22 is a diagram showing another embodiment of a supply voltage generating circuit or a substrate bias generating circuit.

FIG. 22 shows another embodiment of the power supply generating circuit or the substrate bias generating circuit. The power supply generating circuit or the substrate bias is composed of an amplifier AMP02 for amplifying the current, resistors RES02 and RES03 for controlling the output voltage of the AMP02, MOS transistors MOS03 for a switch for selecting one of the resistors RES03, and a current limiting resistor RES01. The decoder signal N17 is served to select one of the MOS transistors MOS03. The resistors RES03 have their own resistances, which are selected by the MOS03. The resistances of the selected RES03 and the RES02 determine the voltage to be outputted by the amplifier AMP02. This operation results in making it possible to control the voltage generated by the power supply generating circuit or the substrate bias generating circuit through the decoder signal N17.

The substrate bias generating circuit needs two types of the circuit shown in FIG. 22, which are used for the PMOS transistor substrate and the NMOS transistor. If the substrate bias generating circuit feeds the forward bias, the current-limiting resistor RES01 suppresses the increase of the leak current, thereby improving the reliability in the operation of the main circuit.

Figure 23:
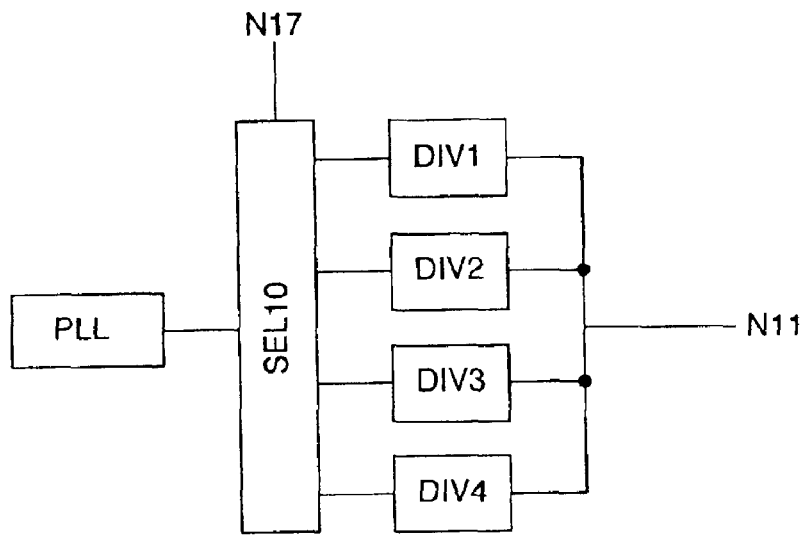
FIG. 23 is a block diagram showing an embodiment of a clock signal generating circuit.

FIG. 23 shows an embodiment of the clock signal generating circuit. The clock signal generating circuit is composed of a phase locked loop PLL, a selector SEL10, and dividers DIV1, DIV2, DIV3 and DIV4. The clock signal is generated by the phase locked loop PLL. The decoder signal N17 is used for selecting the divider to which the selector SEL10 conveys the clock signal generated by the PLL. The selected divider operates to divide the frequency of the clock signal and then output the result to N11. The divider may be a one-time, a half-time, a one-third-time, or a quarter-time circuit. This process makes it possible to generate the clock signal with a target frequency through the use of the decoder signal N17.

Figure 24:
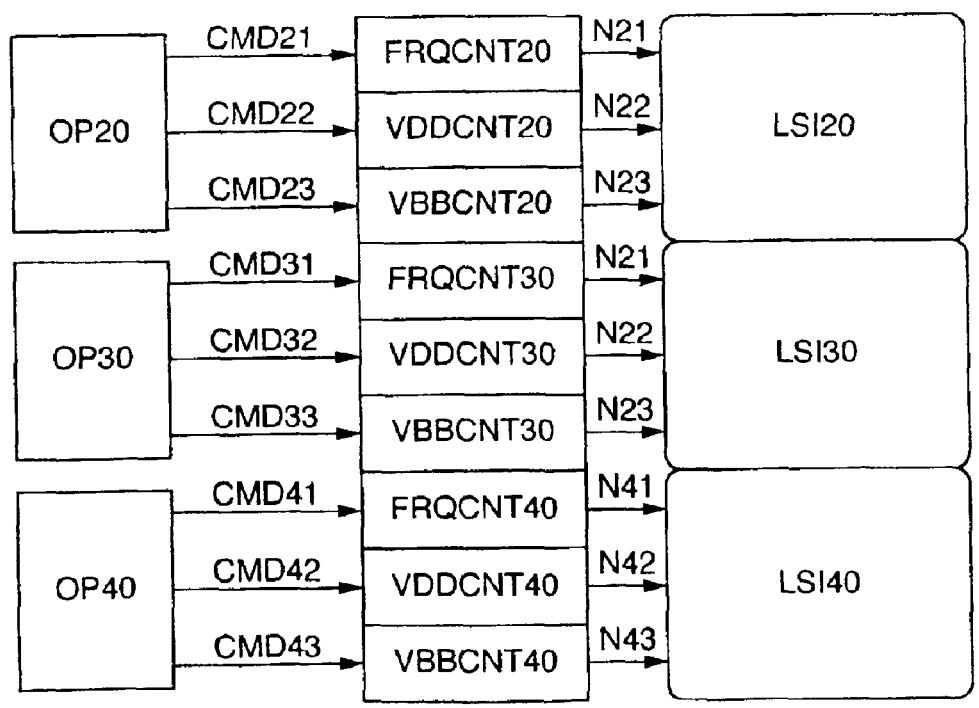
FIG. 24 is a block diagram showing another embodiment of the present invention.

FIG. 24 shows another embodiment of the present invention.

According to another embodiment of the invention, the main circuit is divided into circuit blocks LSI20, LSI30 and LSI40, each of which has a command generating circuits OP20, OP30 and OP40. The command generating circuits OP20, OP30 and OP40 are served to output the command signals CMD21, CMD22, CMD23, CMD31, CMD32, CMD33, CMD41, CMD42, CMD43 for meeting the requested performance for each block. The clock frequency controlling circuits FRQCNT20, FRQCNT30 and FRQCNT40, the power supply controlling circuit VDDCNT20, VDDCNT30 and VDDCNT40, and the substrate bias controlling circuit VBBCNT20, VBBCNT30 and VBBCNT40 are served to generate the corresponding control signals to their command signals and then supply the control signals to the blocks. This division of the control leads to improving the performance of the semiconductor integrated circuit device more.

Figure 25:
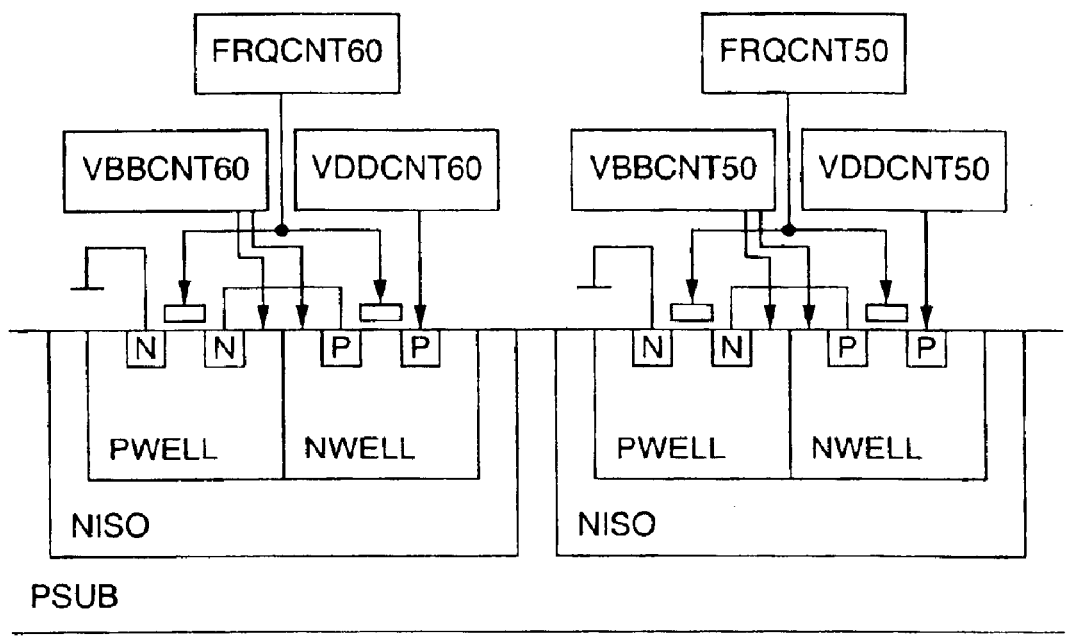
FIG. 25 is a view showing an embodiment of a transistor section.
Figure 26:
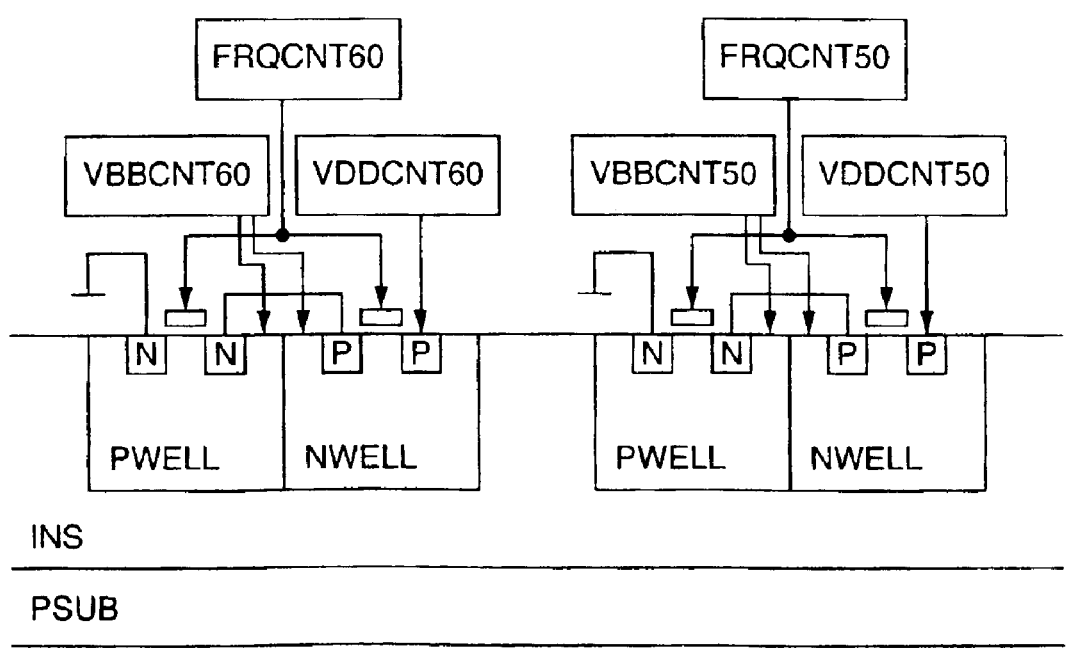
FIG. 26 is a view showing another embodiment of a transistor section.

In performing the substrate bias control of the aforementioned embodiments, especially in the case of dividing the control in the main circuit as in the embodiment shown in FIG. 24, it is necessary to divide the substrate as shown in the section of FIG. 25 or FIG. 26. The section of FIG. 25 is called a triple well structure. In the conventional MOS transistor, for forming the NMOS transistor and the PMOS transistor, an n-type well NWELL for the NMOS transistor is formed on the p-type substrate PSUB and an n-type diffusion layer N and a p-type diffusion layer P are located in the well NWELL. However, this structure allows all the p-type wells of the NMOS transistor to connect to each other through the p-type substrate PSUB. Hence, it is necessary to separate the n-type well from the p-type well for controlling the substrate bias.

In the structure shown in FIG. 25, by forming the n-type isolation layer, the p-type well PWELL is separated from the n-type well NWELL. The structure shown in FIG. 26 is called a silicon on insulator structure, in which by forming an insulating layer INS composed of an oxide film between the MOS transistor and the p-type substrate PSUB, the p-type substrate PSUB is separated from the MOS transistor.

Figure 27:
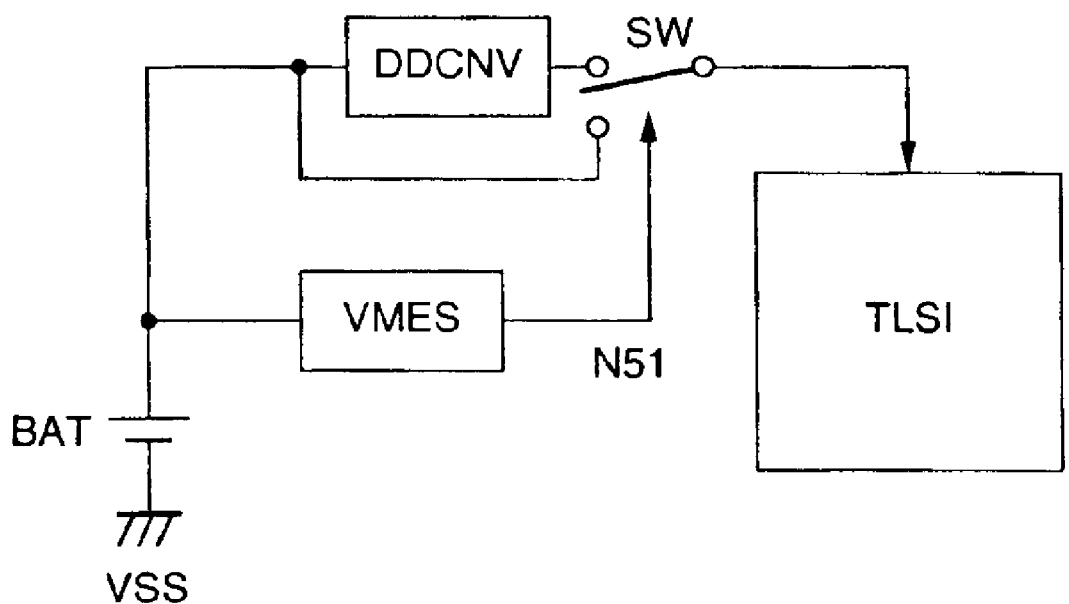
FIG. 27 is a block diagram showing another embodiment of the present invention.

FIG. 27 shows another embodiment of the invention.

This system shown in FIG. 27 is composed of the semiconductor integrated circuit device according to the invention, a battery BAT, a voltage converter DDCNT, a switch SW, and a voltage measuring circuit VMES. In this embodiment, the voltage fed by the battery BAT is fed to the device TLSI as its power supply through the voltage converter DDCNV and the switch SW. The voltage measuring circuit VMES measures the voltage of the battery BAT. If the voltage is measured to be down, the circuit VMES sends the signal N51 for operating the switch SW so that the output of the battery BAT may be directly supplied to the device TLSI as its power supply.

In a case that the semiconductor integrated circuit device TLSI according to the invention is powered by the battery BAT, in the normal state, the voltage converter circuit DDCNT stabilizes the voltage outputted by the battery BAT. If the remaining quantity of the battery BAT becomes smaller, the voltage converter DDCNV is required to raise the voltage. Hence, the using efficiency of the battery is made worse. To overcome this shortcoming, the voltage measuring circuit VMES measures how much the output voltage of the battery BAT is lowered and then operates the switch SW so that the output of the battery BAT may be directly supplied to the device TLSI. This process makes it possible to extend the life of the battery BAT. The degrade of the feeding capability of the battery can be suppressed by applying the substrate bias, for example.

In the foregoing description, the clock frequency controlling circuit and the clock signal generating circuit have the same function. Likewise, the power supply controlling circuit and the supply voltage generating circuit have the same function. The substrate bias controlling circuit and the substrate bias generating circuit have the same function as well.

Since any of the clock frequency, the supply voltage and the substrate bias may be adjusted in the composition of the semiconductor integrated circuit device, the resulting semiconductor integrated circuit has a high operating speed without having to greatly increase the power consumption.

What is claimed is:

1. A semiconductor integrated circuit device comprising:
   a first circuit including at least one MOS transistor;
   a second circuit to control a frequency of a clock signal to be supplied to the first circuit;
   a third circuit to control a supply voltage of the first circuit;
   a fourth circuit to control a substrate bias voltage supplied to a semiconductor region where the at least one MOS transistor of the first circuit is formed; and
   a command generating circuit to generate first and second commands for respectively controlling the second and third circuits,
   wherein the command generating circuit generates the first command to control the second circuit and the second command to control the third circuit using a table storing a correspondence between frequencies of the clock signal and supply voltages supplied to the first circuit, and wherein the fourth circuit controls the substrate bias voltage to enable an operation of the first circuit based on the frequency of the clock signal controlled by the first command.

2. The semiconductor integrated circuit device according to claim 1, wherein the command generating circuit selects the lowest possible value of the supply voltage for enabling the operation of the first circuit based on the frequency of the clock signal controlled by the first command, from the table.

3. The semiconductor integrated circuit device according to claim 1, further comprising:

a monitoring circuit to generate a monitoring signal; and a decoder to adjust a value of at least one of the frequency of the clock signal, the supply voltage and the substrate bias voltage;

wherein the monitoring circuit is supplied with the supply voltage and the substrate bias voltage, and wherein the decoder adjusts the value of at least one of the frequency of the clock signal, the supply voltage and the substrate bias voltage so as to correspond the frequency of the clock signal with a frequency of the monitoring signal.

4. The semiconductor integrated circuit device according to claim 3, wherein the monitoring circuit is a delay circuit into which the clock signal is inputted.

5. The semiconductor integrated circuit device according to claim 1, wherein the first circuit is a CMOS circuit.

6. The semiconductor integrated circuit device according to claim 3, wherein the monitoring circuit is a CMOS circuit.

7. A control method for controlling a semiconductor integrated circuit device comprising:

providing a semiconductor integrated circuit device including a first circuit including at least one MOS transistor;

deciding a frequency of a clock signal supplied to the first circuit;

deciding a supply voltage of the first circuit using a table storing a correspondence between frequencies of the clock signal and supply voltages of the first circuit; and controlling a substrate bias voltage of the MOS transistor to enable an operation of the first circuit based on the frequency of the clock signal.

8. The control method according to claim 7, wherein the lowest possible value of the supply voltage for enabling the operation of the first circuit based on the frequency of the clock signal is selected from the table.

9. The control method according to claim 7, wherein the first circuit is CMOS circuit.

* * * * *